United States Patent [19]
Wilson

[11] 4,039,935
[45] Aug. 2, 1977

[54] VARIABLE FREQUENCY STRESS TRANSDUCER

[76] Inventor: John Thomas Richard Wilson, 736 Lynnhaven Lane, La Canada, Calif. 91011

[21] Appl. No.: 647,514

[22] Filed: Jan. 8, 1976

[51] Int. Cl.² ............................................. G01R 33/12
[52] U.S. Cl. ............................ 324/34 ST; 73/DIG. 2; 331/65; 331/113 A
[58] Field of Search ........... 324/34 R, 34 ST, 34 MA; 331/65, 157, 113 A, 181; 73/141 A, DIG. 2

[56] References Cited

U.S. PATENT DOCUMENTS

| | | | |
|---|---|---|---|
| 2,564,777 | 8/1951 | Cavanagh | 324/34 R |
| 2,571,718 | 10/1951 | Howes | 73/DIG. 2 |
| 2,961,602 | 11/1960 | Bender | 331/65 |
| 3,133,256 | 5/1964 | Denelsbeck et al. | 331/113 A |
| 3,319,464 | 5/1967 | Bender | 73/136 |
| 3,940,992 | 3/1976 | Jost et al. | 73/141 A |

FOREIGN PATENT DOCUMENTS

| | | | |
|---|---|---|---|
| 999,040 | 7/1965 | United Kingdom | 324/34 ST |

Primary Examiner—Robert J. Corcoran

[57] ABSTRACT

A magnetostrictive mechanical, variable frequency stress transducer is disclosed in which the frequency of the output signal is proportional to the applied stress. This device consists of a magnetic stress actuating member, to which the stress is applied, and a transistor-magnetic oscillator constructed so the stress sensitive magnetic characteristic of the stress actuating member is the principal frequency determining element of the oscillator.

4 Claims, 4 Drawing Figures

LOUDSPEAKER

HEADPHONE

VARIABLE FREQUENCY STRESS TRANSDUCER

This invention relates to load cells, stress transducers, dynamometers and methods of measuring mechanical stress. This invention discloses means for measuring tensile and compressive stresses. It is an object of this invention to provide a stress transducer which is constant in operation and which can be used for accurately determining the values of rapidly varying stresses as well as stresses involving only microinches of displacement. A further object is to provide a rugged stress transducer which will resist shifting its characteristics due to mechanical shock or vibration. Further objects are to provide a stress transducer with several volts output signal, low power consumption, and a simple, reliable design. A further object is to provide a stress transducer in which the frequency of the output signal is proportional to the applied stress. The variable frequency output signal provides a high signal-to-noise ratio in power-limited applications and is suitable for remote data monitoring.

The invention will be described referring to the sketches of FIGS. 1, 2 and 3 and the typical characteristic of FIG. 4. The objects of the invention are attained by providing a stress actuating member 1 of a magnetic material with magnetic permeability highly susceptible to mechanical stress, a series of coils, 5-6-7, 8-9, 10-11, 12-13, wound around the stress actuating member to facilitate detecting the magnetic permeability of that member and to aide in generating the variable frequency output signal, a transistor-magnetic oscillator using the series of coils around the actuating member, and a magnetic return path 2 for the external coil flux through an unstressed magnetic material.

Figures 1, 2, 3:
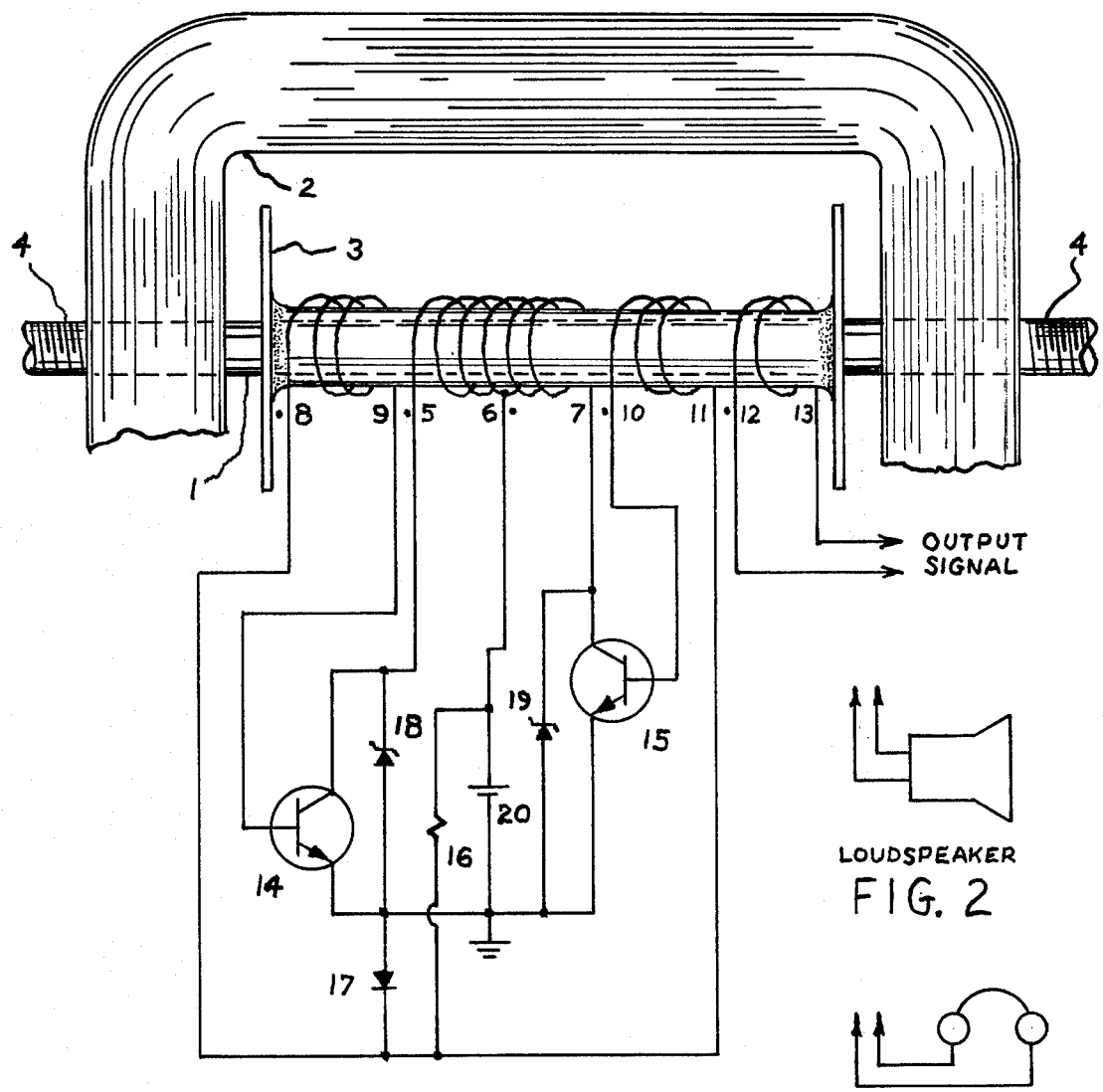
FIG. 1 shows a preferred form of the stress transducer in accordance with the features of this invention.
FIGS. 2 and 3 show a loudspeaker and a headphone respectively which can be connected individually or together to receive the output signal from FIG. 1 to provide an audible signal corresponding to the measured mechanical stress level.
Figure 4:
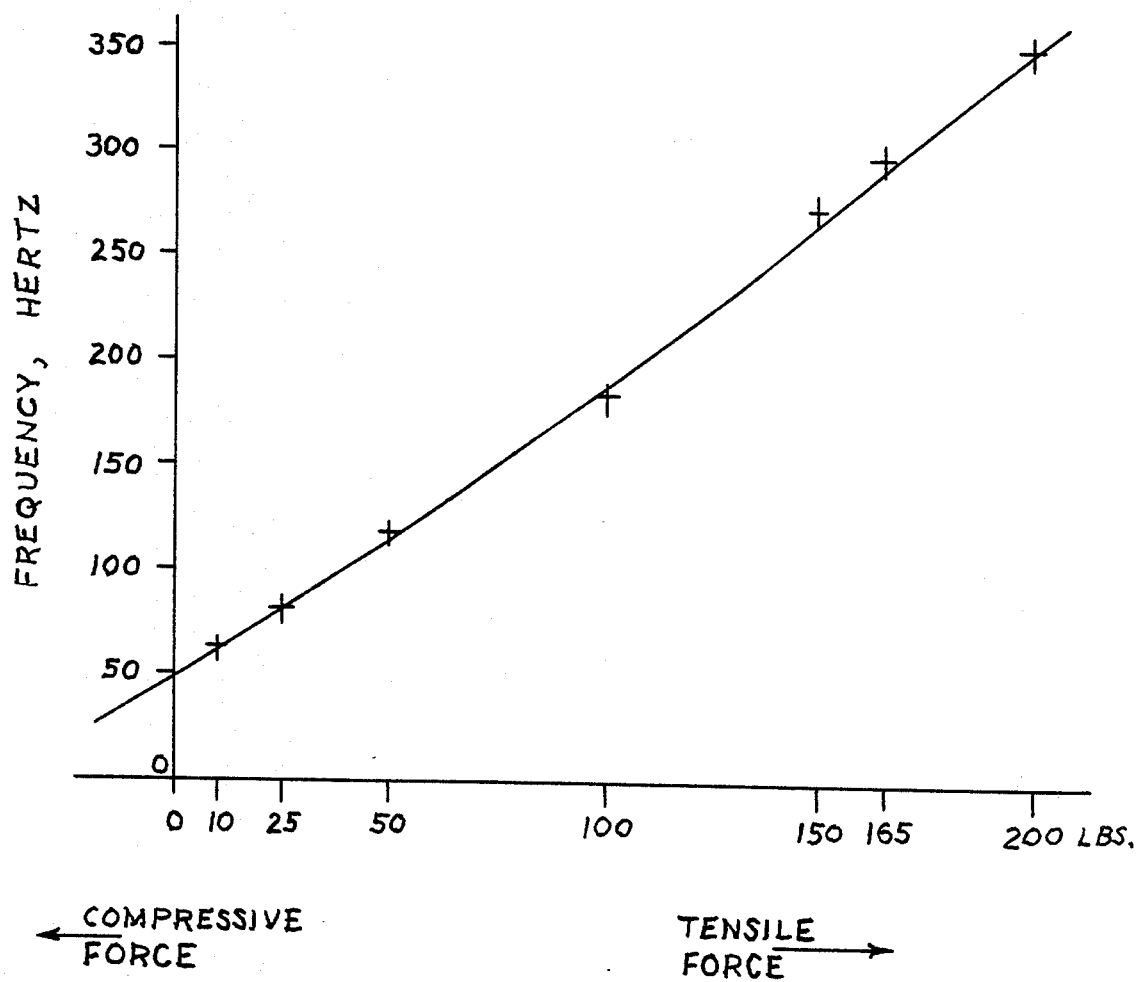
FIG. 4 shows a typical response curve for the invention showing the monotonic output-signal frequency versus tensile and compressive forces.

Referring to FIG. 1, the stress actuating member 1 has tensile or compressive force applied along its axis between coupling ends 4. The force causes a change in the permeability of member 1 which causes the frequency of the transistor-magnetic oscillator to shift in a manner which correlates with the magnitude and direction of the force. Notice from FIG. 4 that each force is measured as a unique frequency and that there is a continuum of unique frequencies for a continuum of loads. The frequency of oscillation is principally dependent upon the magnetic characteristics of the stress actuating member, the DC battery voltage, the cross sectional area of the stress actuating member, the number of wire turns in coils 5-6-7, the magnetic coupling between said coils and the stress actuating member, the magnetic reluctance between the stress actuating member and the external coil flux magnetic return path, and the magnetic characteristics of the external coil flux magnetic return path. The invention is preferably configured as a stress transducer so the stress actuating member magnetic characteristic is the major determinant of the oscillating frequency. This is done by holding the DC battery voltage constant, fixing the number of wire turns for any one device, making the magnetic coupling between the coils and the stress actuating member as tight as possible by using a very thin bobbin which closely but freely fits over the stress actuating member, and by making a large area with a small gap between the stress actuating member and the external coil flux magnetic return path. The external coil flux magnetic return path 2 is preferred to be laminated as shown in FIG. 1. The output signal may be directly coupled from the oscillator transistor collectors or from one collector to ground; however, the separate coil 12-13 is provided for that purpose and is preferred.

The transistor-magnetic oscillator may be any of numerous configurations (described in the literature) based on the concept described by Uchrin and Taylor in "A New Self-Excited Square-Wave Oscillator," Proceedings of the Institute of Radio Engineers, Volume 43, page 99, (1955). FIG. 1 shows the oscillator with NPN transistors 14 and 15, temperature conpensation diode 17, transistor over-voltage protection zener diodes 18 and 19, self-starting resistor 16, DC battery 20, and coils 8-9, 5-6-7, 10-11, 12-13 wound on bobbin 3. The transistor-magnetic oscillator may be constructed using PNP transistors with the appropriate battery and diode polarity changes.

I claim as my invention the following:

1. A variable frequency stress transducer for measuring mechanical stress comprising a magnetic member in which the magnetic characteristics are varied by the applied mechanical stress, a means for applying a mechanical force to said member to cause mechanical stress in said member, a flux path means for magnetic flux to flow through said member thence through a magnetic yoke external to said member and returning to said member, multiple winding means inductively linking said yoke and member, a magnetic multivibrator utilizing said winding means in which the frequency of oscillation is determined principally by the time required to drive magnetic flux reciprocally through said flux path between one polarity near-maximum flux-level and the opposite polarity near-maximum flux-level, and output stress signal winding means linking said flux path for deriving an induced output stress signal from said multivibrator.

2. A variable frequency stress transducer for measuring mechanical stress comprising a magnetic member in which the magnetic characteristics are varied by the applied mechanical stress, a means for applying a mechanical force to said member to cause mechanical stress in said member, a flux path means for completing a magnetic flux path through said member thence through a magnetic yoke external to said member and returning to said member, multiple winding means inductively linking said flux path, a magnetic multivibrator utilizing said multiple winding in which the frequency of oscillation is determined principally by the time required to drive magnetic flux reciprocally through said flux path between one polarity near-maximum flux level and the opposite polarity near-maximum flux level, a stress signal winding means linking said flux path, and an electrical-to-audio converter driven from the stress signal winding which converts the stress signal into a sub-audible, audible, or ultrasonic pressure wave.

3. A variable frequency stress transducer for measuring mechanical stress as an electrical output signal of unique fundamental frequency for each stress state consisting of a magnetic member in which said mechanical stress is induced by an applied force and in which the magnetic characteristics are changed by said mechanical stress, a magnetic yoke completing a closed magnetic flux path from near one end of said member to near the other end of said member through standard fit joints between said member and said yoke, first and second winding means inductively linking said flux path, a unidirectional and constant source of voltage with two terminals, a pair of bipolar transistors of like type and polarity each having base, emitter, and collector electrodes, said source of voltage connected between the emitter electrode and the base electrode of each of said transistors through a portion of said first winding means, the emitter electrode of each of said transistors being connected to one of said terminals, the collector electrode of each of said transistors being connected to the other of said terminals through a portion of said second winding means, said first winding means being connected to apply voltages induced therein between the base electrode and the emitter electrode of each of said transistors, each of said transistors being reciprocally and alternately rendered into a cut-off and conducting current condition in response to said induced voltages, each of the transistors being biased so as to transfer from one to the other of said conducting conditions in response to the voltage induced in said first winding means upon each occurrence of the maximum magnetic flux level permitted through said flux path by said mechanical stress, and a third winding means linking said flux path from which the electrical output signal is obtained.

4. A variable frequency stress transducer for measuring mechanical stress as an electrical output signal of unique fundamental frequency for each stress state consisting of a magnetic member in which said mechanical stress is induced by an applied force and in which the magnetic characteristics are changed by said mechanical stress, a magnetic yoke completing a closed magnetic flux path from near one end of said member to near the other end of said member through standard fit joints between said member and said yoke, a first and second winding means inductively linking said flux path, a unidirectional and constant source of voltage with two terminals, a pair of bipolar transistors of like type and polarity each having a base, emitter, and collector electrode, the emitter electrode of each of said transistors being connected to one of said terminals, the collector electrode of each of said transistors being connected to the other terminal through a portion of said first winding, an oscillation-starter resistor connected from the collector-related terminal to each base electrode through a portion of said second winding, means for bypassing said resistor connected between said resistor-second-winding junction and the emitter electrodes, said second winding means being connected to apply voltages induced therein between the base electrode and the emitter electrode of each of said transistors, each of said transistors being reciprocally and alternately rendered into a cut-off and conducting current condition in response to said induced voltages, each of the transistors being biased so as to transfer from one to the other of said conducting conditions in response to the voltage induced in said second winding means upon each occurrence of the maximum magnetic flux level permitted through said flux path by said mechanical stress, and a third winding means linking said flux path from which the electrical output signal is obtained.

* * * * *